(12) United States Patent
Faul et al.

(10) Patent No.: US 12,176,339 B2
(45) Date of Patent: Dec. 24, 2024

(54) ELECTRONIC DEVICE AND CHARGE PUMP CIRCUIT

(71) Applicant: Infineon Technologies AG, Neubiberg (DE)

(72) Inventors: Juergen Faul, Radebeul (DE); Andreas Urban Bertl, Villach (AT); Henning Feick, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 226 days.

(21) Appl. No.: 17/873,742

(22) Filed: Jul. 26, 2022

(65) Prior Publication Data

US 2023/0029591 A1 Feb. 2, 2023

(30) Foreign Application Priority Data

Jul. 30, 2021 (EP) ..................... 21188959

(51) Int. Cl.
*H01L 27/02* (2006.01)
*G05F 3/20* (2006.01)

(52) U.S. Cl.
CPC .......... *H01L 27/0222* (2013.01); *G05F 3/205* (2013.01)

(58) Field of Classification Search
CPC ............. H01L 27/0222; H01L 27/0814; H01L 27/1207; H01L 28/40; H01L 29/861; G05F 3/205; H02M 3/003; H02M 3/075
See application file for complete search history.

(56) References Cited

U.S. PATENT DOCUMENTS

| | | | | |
|---|---|---|---|---|
| 2005/0253197 A1* | 11/2005 | Tokushige | ............... | H01L 21/84 257/E21.703 |
| 2006/0125014 A1* | 6/2006 | Chong | ................ | H01L 27/0255 257/E29.327 |
| 2012/0146148 A1* | 6/2012 | Iwamatsu | ............... | H01L 21/84 257/351 |
| 2013/0307074 A1* | 11/2013 | Cheng | ..................... | H01L 28/20 257/E21.409 |
| 2016/0293779 A1* | 10/2016 | Bao | ...................... | H03H 7/0153 |
| 2018/0337596 A1* | 11/2018 | Koe | ...................... | H02M 3/073 |

* cited by examiner

*Primary Examiner* — S M Sohel Imtiaz
(74) *Attorney, Agent, or Firm* — Murphy, Bilak & Homiller, PLLC

(57) ABSTRACT

An electronic device is disclosed. The electronic device includes: a first doped region of a first doping type arranged in a first semiconductor layer of a second doping type complementary to the first doping type; an insulation layer formed on top of the first semiconductor layer and adjoining the first doped region; at least two active device regions arranged in a second semiconductor layer formed on top of the insulation layer; and an electrical connection between one of the at least two active device regions and the first doped region. Each of the at least two active device regions is arranged adjacent to the first doped region and separated from the first doped region by the insulation layer.

14 Claims, 6 Drawing Sheets

ELECTRONIC DEVICE AND CHARGE PUMP CIRCUIT

TECHNICAL FIELD

This disclosure relates in general to an electronic device and a charge pump circuit.

BACKGROUND

In particular, the disclosure relates to an electronic device that includes a semiconductor layer, an insulation layer formed on top of the semiconductor layer, and active device regions formed on top of an insulation layer. During operation, a predefined electrical potential, such as ground potential, may be applied to semiconductor layer and electrical potentials that are significantly different from the predefined potential may be applied to the active device regions.

There is a need for an electronic device that is capable of withstanding high voltages between the active device regions and the semiconductor layer without increasing a thickness of the insulation layer.

SUMMARY

One example relates to an electronic device that includes a first doped region of a first doping type arranged in a first semiconductor layer of a second doping type complementary to the first doping type, an insulation layer formed on top of the first semiconductor layer and adjoining the first doped region, at least two active device regions arranged in a second semiconductor layer formed on top of the insulation layer, and an electrical connection between one of the at least two active device regions and the first doped region. Each of the at least two active device regions is arranged adjacent to the first doped region and separated from the first doped region by the insulation layer.

Another example relates to an electronic circuit with a plurality of electronic devices of the type outlined above and with a plurality of capacitors, wherein the first doped regions of the electronic devices are arranged in the same first semiconductor layer and are spaced apart from each other in the first semiconductor layer, wherein the electronic devices are connected in series, wherein each of the capacitors is connected to a respective one of a plurality of taps, and wherein each tap is a circuit node between a respective pair of the electronic devices in the series circuit.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
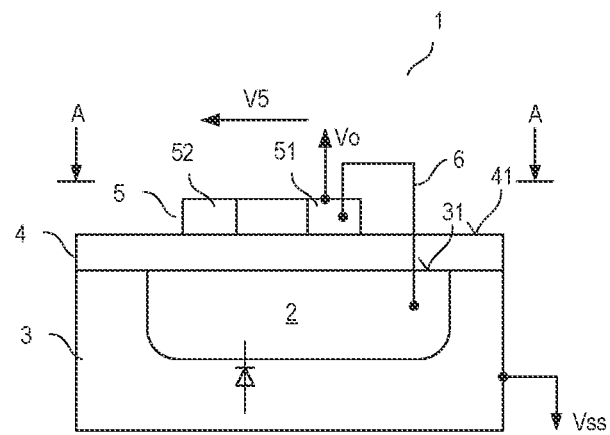
FIG. 1 shows a vertical cross-sectional view of an electronic device according to an example, wherein the electronic device that includes a first doped region in a first semiconductor layer, an insulation layer on top of the first semiconductor layer, and at least two active device regions in a second semiconductor layer on top of the insulation layer.
Figure 2:
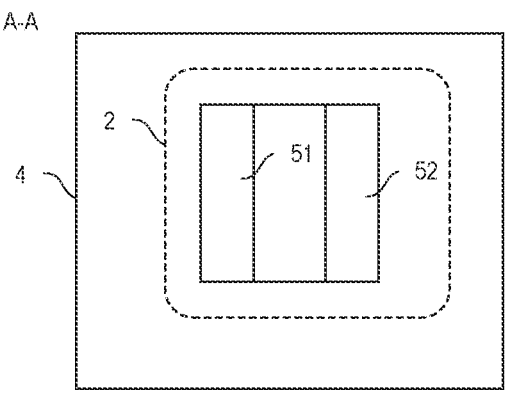
FIG. 2 shows a top view of the second semiconductor layer according to an example.

FIG. 1 shows a vertical cross-sectional view and FIG. 2 shows a top view of a semiconductor device according to one example. Referring to FIG. 1, the electronic device includes a first doped region 2 of a first doping type that is arranged in a first semiconductor layer 3 of a second doping type complementary to the first doping type, so that a pn-junction is formed between the first doped region 2 and regions of the first semiconductor layer 3 adjoining the first doped region 2. This pn-junction is represented by the circuit symbol of a diode shown in FIG. 1.

Referring to FIG. 1, the electronic device further includes an insulation layer 4 formed on top of the first semiconductor layer 3, wherein the insulation layer 4 adjoins the first doped region 2. More specifically, the insulation layer 4 is formed on top of a surface 31 of the first semiconductor layer 3. The first doped region 2 extends to the surface 31 of the first semiconductor layer 3, so that the insulation layer 4 formed on top of the surface 31 adjoins the first doped region 2. FIG. 1 shows a vertical cross-sectional view of the electronic device in a section plane that is essentially perpendicular to the surface 31 of the first semiconductor layer 3 and the surface 41 of the insulation layer 4. FIG. 2 shows a top view of the second semiconductor layer 5 and the surface 41 of the insulation layer 4.

Referring to FIG. 1, the semiconductor device further includes a second semiconductor layer 5 formed on top of the insulation layer 4. More specifically, the second semiconductor layer 5 is formed on top of a surface 41 of the insulation layer 4, wherein the surface 41 of the insulation layer 4 faces away from the first semiconductor layer 3. The electronic device further includes at least two active device regions 51, 52 that are arranged in the second semiconductor layer 5. These active device regions 51, 52 are only schematically illustrated in FIG. 1. More detailed examples are explained herein further below.

Referring to FIG. 1, the electronic device further includes an electrical connection 6 between one of the at least two active device regions 51, 52 and the first doped region 2. This electrical connection 6 is only schematically illustrated in FIG. 1. More detailed examples of the electrical connection 6 are explained herein further below.

Furthermore, the second semiconductor layer 5 is positioned on top of the insulation layer 4 relative to a position of the first doped region 2 in the first semiconductor layer 3 such that each of the at least two active device regions 51, 52 is arranged adjacent to the first doped region 2 and separated from the first doped region 2 by the insulation layer 4. In other words, a vertical projection of each of the at least two active device regions 51, 52 onto the first semiconductor layer 3 is located within the first doped region 2. This is schematically illustrated in FIG. 2 in which the position of the first doped region 2 in the first semiconductor layer 3 is schematically illustrated in dashed lines.

In the example shown in FIGS. 1 and 2, the second semiconductor layer 5 forms an island on top of the surface 41 of the insulation layer 4, wherein a size of the island-like second semiconductor layer 5 in a horizontal plane is smaller than a size of the first doped region 2 in the horizontal plane, so that the vertical projection of the second semiconductor layer 5 onto the first semiconductor layer 1 is entirely within the first doped region 2. This, however, is only an example. According to another example (not shown) a vertical projection of the second semiconductor layer 5 onto the first semiconductor layer 3 extends beyond the first doped region 2. However, in each case, vertical projections of the at least two active device regions 51, 52 onto the first semiconductor layer 3 are located within the first doped region 2.

According to one example, the electronic device is configured to receive a first supply potential Vo. More specifically, one of the first and second active regions 51, 52 is configured to be connected to a circuit node that receives the first supply potential Vo. In the example shown in FIG. 1, a first one 52 of the at least two active device regions 51, 52 receives the first supply potential Vo. The first active device region 51 is that one of the at least two active device regions 51, 52 that is connected to the first doped region 2. This, however, is only an example. The active device region connected to the first doped region 2 is not necessarily the active device region that receives the first supply potential Vo. According to another example (not shown) the first active device region 51 receives the first supply potential Vo and the second active region 52 is connected to the first doped region 21, or vice versa.

During operation of the electronic device, a voltage V5 may occur between the first active device region 51 and the second active device region 52. This voltage may have a maximum magnitude, wherein the maximum magnitude may be defined by the way the electronic device is operated in an electronic circuit (not shown) that uses the electronic device, or may be defined by a voltage blocking capability of the electronic device. The "voltage blocking capability" is the maximum voltage the electronic device can withstand between the first active device region 51 and the second active device region 52.

In each case, due to connecting the first doped region 2 to one of the first and second active device regions 51, 52, a maximum magnitude of a voltage between the second semiconductor layer 5 and the first doped region 2 across the insulation layer 4 is given by the maximum magnitude of the voltage between the first and second active regions 51, 52.

Referring to FIG. 1, the first semiconductor layer 1 may be configured to receive a second electrical potential Vss that is different from the first potential Vo. According to one example, polarities of the first potential Vo and the second potential Vss and the first and second doping types of the first doped region 2 and adjoining regions of the first semiconductor layer 1 are adapted to one another such that the pn-junction between the first doped region 2 and the adjoining regions of the first semiconductor layer 3 is reverse biased when the first potential Vo is received by the one of the first and second active device regions 51, 52 and the second potential Vss is received by the first semiconductor layer 1. If, for example, the first potential Vo is positive relative to the second potential Vss, the first doping type of the first doped region 2 is an n-type, while the second doping type of the first semiconductor layer 1 is a p-type. In this way, the pn-junction between the first doped region 2 and the adjoining regions of the first semiconductor layer 1 is reverse biased when the first and second potentials Vo, Vss are applied to the electronic device.

According to one example, the first semiconductor layer 3 comprises monocrystalline silicon (Si). The insulation layer 4 may include silicon oxide. The second semiconductor layer 5 may include monocrystalline Si or may include $Si_{1-x}Ge_x$, wherein Ge is germanium and x is selected from between 0 and 30%. According to one example, a thickness of the insulation layer 4 is selected from between 10 nanometers (nm) and 30 nanometers, and a thickness of the second semiconductor layer 5 is selected from between 5 nanometers and 15 nanometers. The "thickness" is the dimension of the respective layer in a direction perpendicular to the surface 41 of the insulation layer 4.

Figure 3:
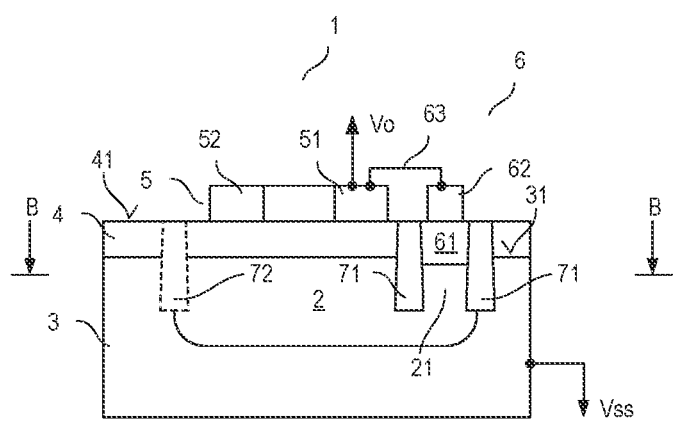
FIG. 3 shows a modification of the electronic device according to FIG. 1.
Figure 4:
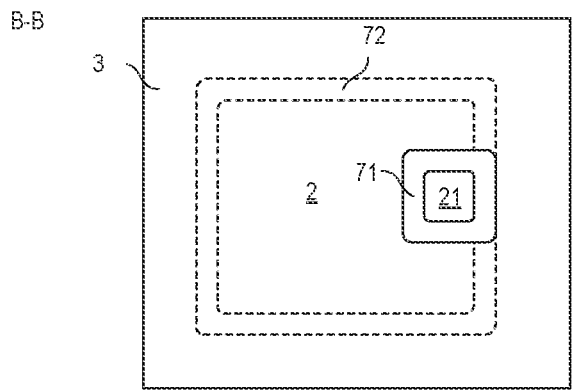
FIG. 4 shows a horizontal cross-sectional view of the first semiconductor layer in the electronic device according to FIG. 3.

FIGS. 3 and 4 show one example of the electronic device shown in FIGS. 1 and 2 in greater detail. FIG. 3 shows a vertical cross-sectional view of the electronic device and FIG. 4 shows a horizontal cross-sectional view in a section plane B-B that cuts through the first semiconductor layer 3. The "horizontal section plane" is a plane that is essentially parallel to the surface 31 of the first semiconductor layer 3.

Referring to FIG. 3, the electrical connection 6 between the one of the at least two active device regions 51, 52 (the first active device region 51 in the example shown in FIG. 3) and the first doped region 2 includes an electrically conducting via 61 that extends from the surface 41 of the insulation layer 4 through the insulation layer 4 to or into the first doped region 2. This electrically conducting via 61 is electrically connected to the first active device region 51 via a conductor 63, wherein this conductor 63 is only schematically illustrated in FIG. 1. The conductor 63 may include any type of electrical conductor and include any type of electrically conducting material such as, for example, aluminum (Al), copper (Cu), Titanium (Ti), tungsten (W) or the like. The electrical conducting via 61 includes tungsten (W), for example. Optionally, the conductor 63 is connected to the via 61 via a contact region 62 formed on top of the via 61. According to one example, the contact region 62 is a doped semiconductor region of the first or second doping type. According to one example, the semiconductor region forming the contact region 62 is spaced apart from the second semiconductor layer 5.

Referring to FIG. 3, the electronic device may include an insulating region 71 that extends from the surface 41 of the insulation layer 4 through the insulation layer 4 into the first semiconductor layer 3, wherein the insulating region 71 forms a collar that surrounds the conducting via 61 and a section 21 of the first doped region 2. According to one example, a vertical dimension of the insulating region 71 is such that the insulating region 71 extends between 100 nanometers (nm) and 500 nanometers, in particular between 200 nanometers and 400 nanometers, into the semiconductor layer 3. The "vertical dimension" is the dimension in the vertical direction of the semiconductor layer 3, which is a direction perpendicular to the first surface 31.

Optionally, the electronic device includes a further insulating region 72. In the following, the further insulating region 72 is also referred to as second insulating region, and insulating region 71 is also referred to as first insulating region. The second insulating region 72 extends from the surface 41 of the insulation layer 4 into the first semiconductor layer 3, at least partially surrounds the first doped region 2, and separates those sections of the first doped region 2 that adjoin the insulation layer 4 from sections of the first semiconductor layer 3. The second insulating region 72 may adjoin the first insulating region 71. According to one example, a vertical dimension of the second insulating region 72 is selected from the same range as the vertical dimension of the first insulating region 71, so that the second insulating region 72 may extend between 100 nanometers (nm) and 500 nanometers, in particular between 200 nanometers and 400 nanometers, into the semiconductor layer 3.

According to the example illustrated in FIG. 3, the first insulating region 71 and the optional second insulating region 72 may extend less deep into the semiconductor layer 3 than the first doped region. According to another example (not shown), the second insulating region 72 extends as deep into the first semiconductor layer 3 as the first doped region 2, so that the pn-junction between the first doped region 2 and adjoining regions of the first semiconductor layer 3 is essentially parallel to the insulation layer 4. According to yet another example (not shown), the second insulating region 72 extends deeper into the first semiconductor layer 3 than the first doped region 2.

Figure 5:
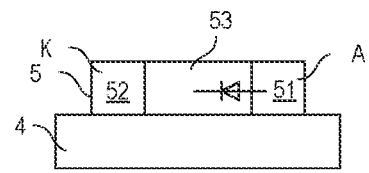
FIG. 5 shows a vertical cross-sectional view of the insulation layer and the second semiconductor layer of an electronic device implemented as a pn-diode.

According to one example, the at least two active device regions 51, 52 are part of a diode. One example of a diode that includes the first and second active device regions 51, 52 is illustrated in FIG. 5. FIG. 5 shows a vertical cross-sectional view of the second semiconductor layer 5 and of a section of the insulation layer 4 adjoining the second semiconductor layer 5. The first semiconductor layer 3 with the first doped region 2 and the electrical connection are not illustrated in FIG. 5.

According to one example, the first active device region 51 is a p-type region and forms an anode of the diode, and the second active device region 52 is an n-type region and forms a cathode K of the diode. Furthermore, the diode may include a base region 53 of an n-type or a p-type, wherein a doping concentration of the base region 53 is much lower than a doping concentration of each of the first and second active device regions 51, 52. According to one example, doping concentrations of the first and second active device regions 51, 52 are in the range of between 1E18 cm$^{-3}$ and 1E21 cm$^{-3}$, while a doping concentration of the base region 53 is between 1E15 cm$^{-3}$ and 1E18 cm$^{-3}$, for example.

It should be noted that the base region 53 is optional. According to another example (not shown) the first active device region 51 forming the anode A adjoins the second active device region 52 forming the cathode K.

Figure 6:
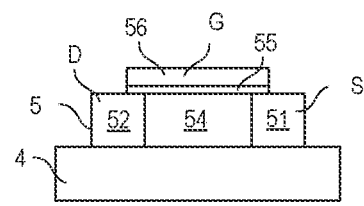
FIG. 6 shows a vertical cross-sectional view of the insulation layer and the second semiconductor layer of an electronic device implemented as a transistor device.

According to another example shown in FIG. 6, the first and second active device regions 51, 52 are part of a transistor, in particular, a MOSFET. In this case, one of the first and second active device regions 51, 52 forms a source region of the MOSFET and the other one of the first and second active device regions 51, 52 forms a drain region of the MOSFET. Just for the purpose of illustration, in the example shown in FIG. 6, the first active device region 51 forms a source region S and the second active device region 52 forms a drain region D. Furthermore, the MOSFET includes a body region 54 arranged between the source region 51 and the drain region 52, and a gate electrode 56. The gate electrode 56 is arranged adjacent to the body region 54 and is dielectrically insulated from the second semiconductor layer 5 by a gate dielectric 55. The gate electrode 56 is configured to control a conducting channel between the source region 51 and drain region 52 along the gate dielectric 55 in the body region 54.

The MOSFET can be an n-type MOSFET or a p-type MOSFET. In an n-type MOSFET, the source and drain regions 51, 52 are n-doped and the body region 54 is p-doped. In a p-type MOSFET, the source region 51 and the drain region 52 are p-doped and the body region 54 is n-doped.

Doping concentrations of the source and drain regions 51, 52 are in the range of between 1E19 cm$^{-3}$ and 1E21 cm$^{-3}$. The doping concentration of the body region 54 is, for example, in the range of between 1E17 cm$^{-3}$ and 1E19 cm$^{-3}$.

According to one example, the MOSFET shown in FIG. 6 is connected as a diode. This is explained with reference to FIGS. 7A-7B and 8A-8B in the following.

Figure 7A:
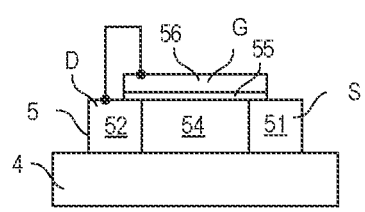
FIGS. 7A and 7B illustrate a diode-connected n-type transistor device and the corresponding circuit symbol, respectively.
Figure 7B:
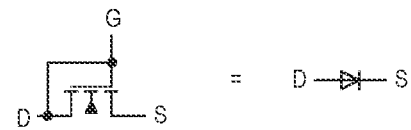

FIGS. 7A and 7B show a vertical cross-sectional view and an equivalent circuit diagram of an n-type MOSFET that is connected as a diode. This MOSFET may also be referred to as diode-connected MOSFET. Referring to FIG. 7A, the drain region 52 is connected to the gate electrode 56. Referring to the equivalent circuit diagram shown in FIG. 7B, the drain region 52 of the MOSFET forms the anode and the source region 51 of the MOSFET forms the cathode of the diode.

Figure 8A:
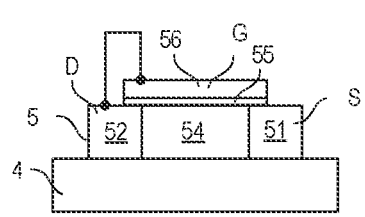
FIGS. 8A and 8B illustrate a diode-connected p-type transistor device and the corresponding circuit symbol, respectively.
Figure 8B:
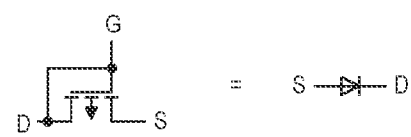

FIGS. 8A and 8B show a vertical cross-sectional view and an equivalent circuit diagram of a p-type MOSFET that is connected as a diode. Referring to FIG. 8A, the drain-region 52 is connected to the gate electrode 56 (which is the same as in the example shown in FIG. 7A). Different from the example shown in FIG. 7B, the source region 51 forms the anode and the drain region 52 forms the cathode of the diode.

Figure 9:
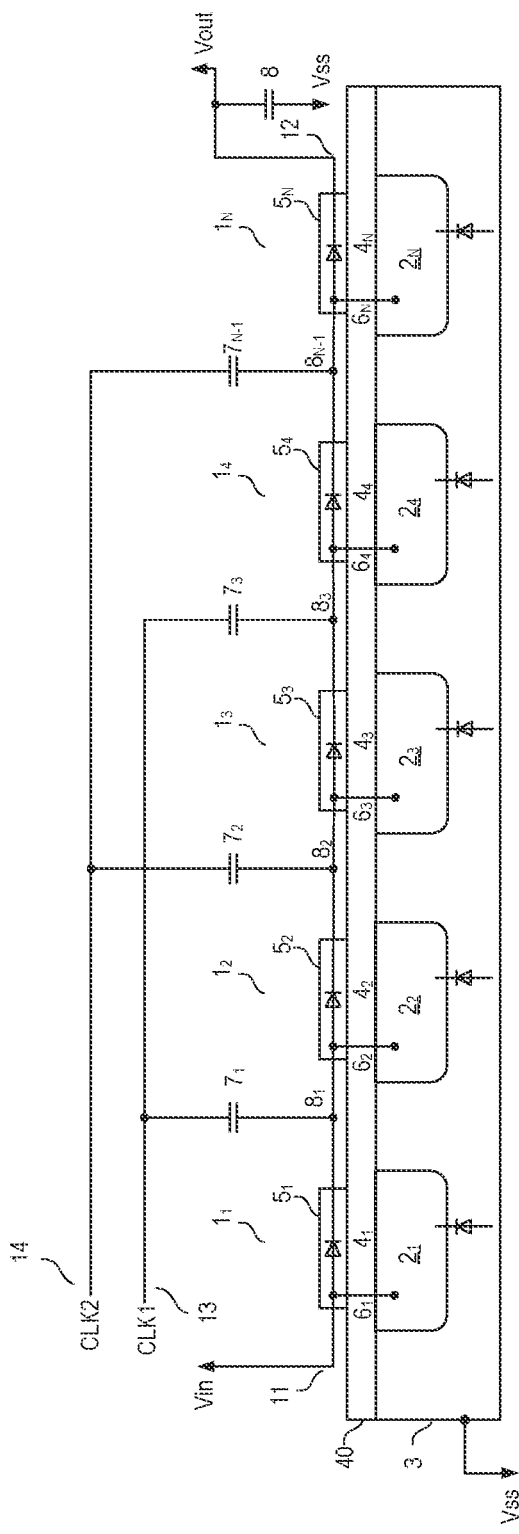
FIG. 9 shows an electronic circuit that includes a plurality of electronic devices and a plurality of capacitors.

FIG. 9 shows one example of a charge pump circuit that includes a plurality of electronic devices $1_1$-$1_N$ of the type explained herein before. Each of these electronic devices has a first doped region $2_1$-$2_N$ arranged in a first semiconductor layer 3, wherein the first semiconductor layer 3 is shared by the plurality of electronic devices $1_1$-$1_N$. Furthermore, insulation layers $4_1$-$4_N$ of the electronic devices $1_1$-$1_N$ are formed by a common insulation layer 40 formed on top of the first semiconductor layer 3. Furthermore, each of the electronic devices $1_1$-$1_N$ includes a diode integrated in a respective second semiconductor layer $5_1$-$5_N$. The second semiconductor layers $5_1$-$5_N$ are formed on top of the insulation layer 40 are spaced apart from each other. Diodes integrated in the respective second semiconductor layers $5_1$-$5_N$ are represented by their circuit symbol in the example shown in FIG. 9. Each of these diodes may be implemented in accordance with any of the examples explained with reference to FIGS. 5, 6, 7A-7B, 8A-8B.

Referring to FIG. 9, each of the electronic devices $1_1$-$1_N$ includes an electrical connection $6_1$-$6_N$ between an active device region in the respective second semiconductor layer $5_1$-$5_N$ and the respective first doped region $2_1$-$2_N$. The active device regions are not explicitly illustrated in FIG. 9. Just for the purpose of illustration it is assumed that, in each of the electronic devices $1_1$-$1_N$, the active device region forming an anode of the respective diode is connected to the respective first doped region $2_1$-$2_N$. This, however, is only an example. According to another example, the active device region forming the cathode of the diode is connected to the respective first doped region $2_1$-$2_N$. It is also possible to implement the charge pump circuit in such a way that one or more of the diodes have their anode connected to the respective first doped region 2 and one or more of the diodes have their cathode connected to the respective first doped region 2.

The electronic devices $1_1$-$1_N$ are connected in series, that is, the diodes implemented in the second semiconductor layers are connected in series between an input node 11 and an output 12 in such a way that the anode of the diode in a first electronic device $1_1$ of the series circuit is connected to the input node 11, the cathode of an N-th electronic device $1_N$ in the series circuit is connected to the output node, and that a current may flow from the input node 11 to the output node 12 via the series circuit. N is selected from between 2 and 20, for example.

The input node 11 is configured to receive an input voltage Vin. According to one example, the input voltage Vin is referenced to the second supply potential Vss. A magnitude of the input voltage is selected from between 1V and 5V, in particular from between 1.5V and 3.3V, for example. The output node 12 is configured to provide an output voltage Vout, wherein the output voltage Vout may also be referenced to the second supply potential Vss.

Furthermore, the charge pump circuit includes a plurality of taps $8_1$-$8_{N-1}$ and a plurality of capacitors $7_1$-$7_{N-1}$. Each tap $8_1$-$8_{N-1}$ is a circuit node at which the diodes of a respective pair of the electronic devices $1_1$-$1_{N-1}$ are connected, and each of the capacitors $7_1$-$7_{N-1}$ has a first node that is connected to a respective one of the taps $8_1$-$8_{N-1}$ and a second node that is connected to one of a first clock node 12 and second clock node 14. More specifically, the taps $8_1$-$8_{N-1}$ include first taps $8_1$, $8_3$ and second taps $8_2$, $8_{N-1}$, wherein the first taps $8_1$, $8_3$ and the second taps $8_2$, $8_{N-1}$ are arranged alternatingly in the series circuit. Capacitors $8_1$, $8_3$ that have their first node connected to one of the first taps $8_1$, $8_3$ have their second node connected to the first clock node 13, and capacitors 72, $7_{N-1}$ that have their first node connected to one of the second taps $8_2$, $8_{N-1}$ have their second node connected to the second clock node 14. Optionally, the charge pump circuit further includes an output capacitor 9 that is connected to the output node 12 and configured to buffer the output voltage Vout.

Figure 10:
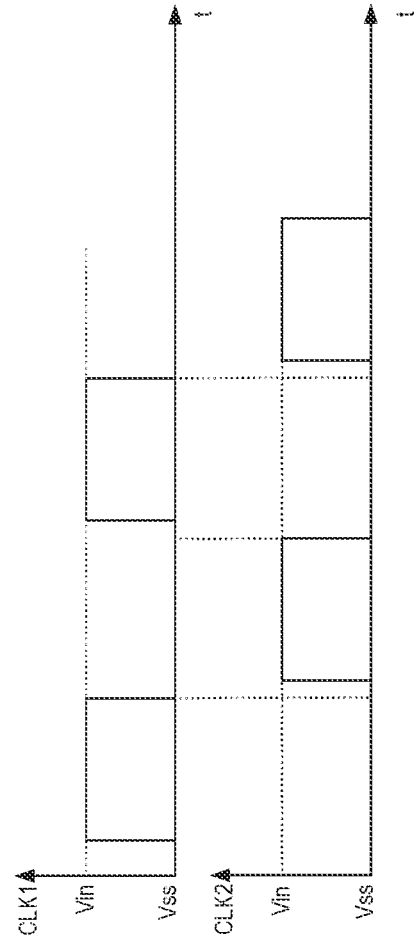
FIG. 10 shows signal diagrams of signals that may be received at clock inputs in the electronic circuit according to FIG. 9.

The charge pump circuit, in a conventional way, is configured to generate the output voltage Vout based on the input voltage Vin such that the output voltage Vout is higher than the input voltage Vin. According to one example, the output voltage Vout is essentially a multiple of the input voltage Vin, wherein a multiplication factor is given by N, that is the number N of diodes $2_1$-$2_{N-1}$ and the number N−1 of capacitors $7_1$-$7_{N-1}$ plus one. For this, the first clock input 13 may receive a first clock signal CLK1 and the second clock input 14 may receive a second clock signal CLK2 (see FIG. 10). Each of these clock signals CLK1, CLKL2 alternates between a first signal level, such as a signal level corresponding to the voltage level of the input voltage Vin, and a second signal level, such as zero. Furthermore, the first clock signal CLK1 and the second clock signal CLK2 are complementary in such a way that they do not have the first signal level at the same time (but may have the second signal level at the same time). One way of operating the charge pump circuit is briefly explained in the following.

When the input voltage Vin is applied to the input node 11 at least a first one $7_1$ of the capacitors $7_1$-$7_{N-1}$ is charged during those time periods in which the first clock signal CLK1 has the second signal level, so that a voltage $V7_1$ across the first capacitor $7_1$ essentially equals the input voltage Vin (when the voltage drop across the diode of the first electronic device is neglected). The "first capacitor $7_1$" is the capacitor that is coupled to the input node 11 via the diode of the first electronic device $1_1$ and is connected to the to the first tap $8_1$, wherein the "first tap $8_1$" is connected to the first electronic device $1_1$ at a circuit node facing away from the input node 11. When the first clock signal CLK1 changes from the lower second signal level to the higher first signal level (such as Vin), the first capacitor $7_1$ is discharged via the diode of the second electronic device $1_2$, so that at least a second one $7_2$ of the capacitors $7_1$-$7_{N-1}$ is charged, wherein a voltage across the second capacitor $7_2$ may reach a voltage level that is twice the voltage level of the input voltage. The "second electronic device $1_2$" is the electronic device that is directly connected to the first electronic device $1_1$ and the first capacitor $7_1$, and the "second capacitor $7_2$" is the capacitor that is connected to a second tape $8_2$, wherein the "second tap $8_2$" is connected to the second electronic device $1_2$ at a circuit node facing away from the first electronic device $1_1$. Whenever the second clock signal CLK2 changes from the low signal level to the high signal level, the second capacitor 72 is discharged and, via the third electronic device $1_3$ charges at least a third capacitor $7_3$, wherein a voltage across the third capacitor $7_3$ may reach a voltage level that is essentially three times the voltage level of the input voltage, and so on. The "third electronic device $1_3$" is the electronic device that is directly connected to the second electronic device $1_2$ and the second capacitor $7_2$, and the "third capacitor $7_3$" is the capacitor that is connected to a third tap $8_3$, wherein the "third tap $8_3$" is connected to the third electronic device $1_3$ at a circuit node facing away from the second electronic device $1_2$.

In the charge pump circuit according to FIG. 9, each of the taps $8_1$-$8_{n-1}$ is connected to a respective one of the first doped regions $2_1$-$2_N$. These taps, during operation of the charge pump circuit, have different electrical potentials. The voltage across the insulating layer $4_1$-$4_N$ of each of the electronic devices $1_1$-$1_N$, however, is not higher than the voltage between the tap that is connected to the first doped region and a neighboring tap downstream the series circuit. That is, for example, the voltage across insulating layer $4_2$ of the second electronic device $1_2$ is given by a magnitude of the voltage between tap $8_1$ connected to the first doped region $2_2$ of the second electronic device $1_2$ and neighboring tap $8_2$ arranged downstream in the series circuit.

Basically, the voltage between two of these taps is not higher than the input voltage Vin. Thus, even in a charge pump circuit that provides an output voltage Vout that is a multiple of the input voltage Vin, a required dielectric strength of the insulating layer 40 is given by the input voltage Vin. A voltage blocking capability of the pn-junctions formed between the first doped regions $2_1$-$2_N$, however, is higher than the dielectric strength of the insulating layer 4. The voltage blocking capability of these pn-junctions can be adjusted by suitably adjusting the doing concentrations of the first doped regions $2_1$-$2_N$ and a basic doping of the first semiconductor layer 3.

Referring to the above, the first semiconductor layer 3 may be connected to a second electrical potential Vss, such as ground potential. According to one example illustrated in FIG. 11, the first semiconductor layer 3 includes a plurality of doped regions $31_1$-$31_{N-1}$ of the second doping type, wherein each of these doped regions $31_1$-$31_{N-1}$ is arranged between a pair of first doped regions $2_1$-$2_N$. Each of these doped regions $31_1$-$31_{N-1}$ is connected to the second electrical potential Vss. Electrical connections between the doped regions $31_1$-$31_{N-1}$ and the second electrical potential Vss are only schematically illustrated in FIG. 11. The doped regions $31_1$-$31_{N-1}$ may be connected to the second electrical potential Vss by electrical connections of the same type as explained with reference to FIG. 3 in context with connecting the first doped region 2 to the first active device region 51.

Figure 11:
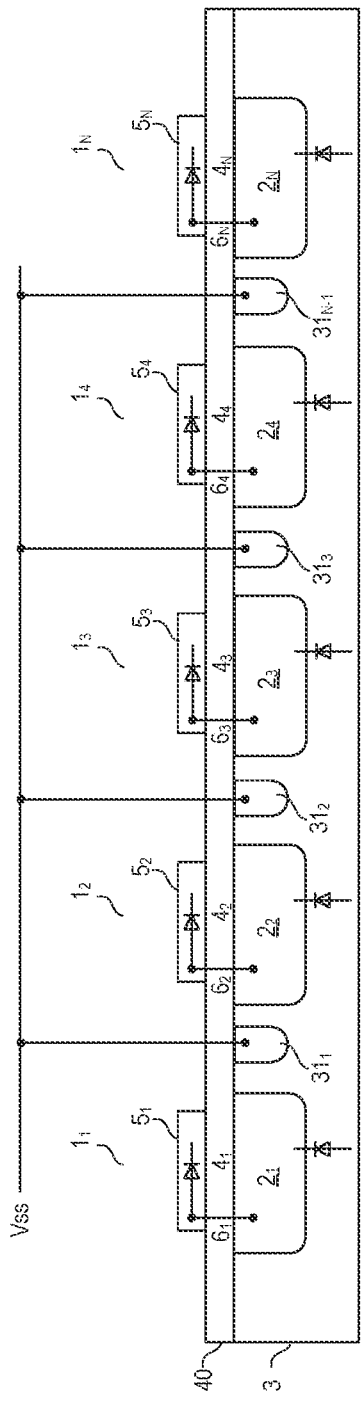
FIG. 11 illustrates one example of how the first semiconductor layer in the electronic circuit according to FIG. 9 may be connected to a supply potential.

For the ease of illustration, FIG. 11 only illustrates the electronic devices $1_1$-$1_N$ and the doped regions $31_1$-$31_{N-1}$. The capacitors of the charge pump circuit are not illustrated in FIG. 11.

According to one example, the doped regions $31_1$-$31_{N-1}$ are part of doped rings of the second doping type, wherein each of these rings surrounds a respective one of the first doped regions $2_1$-$2_N$.

Figure 12:
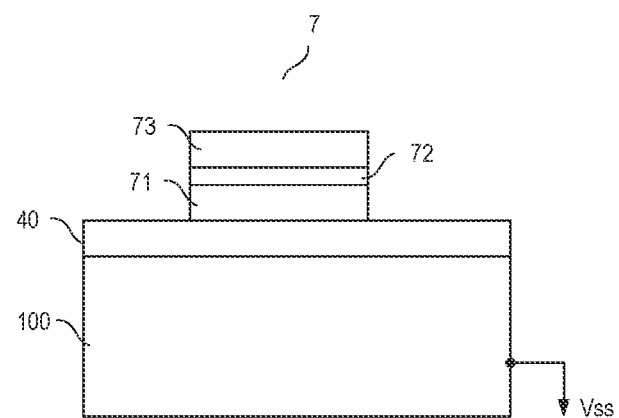
FIG. 12 shows a vertical cross-sectional view of a capacitor according to one example.

According to one example, the capacitors $7_1$-$7_{N-1}$ of the charge pump circuit are formed on the same insulating layer 40 on top of which the second semiconductor layers $5_1$-$5_n$ are formed. FIG. 12 illustrates one example of a capacitor 7 formed on top of the insulating layer 40. In this example, the capacitor 7 includes a first capacitor electrode 71 formed on top of the insulating layer 40, a capacitor dielectric 72 formed on top of the first capacitor electrode 71, and a second capacitor electrode 73 formed on top of the capacitor dielectric 72. The first capacitor electrode 71 forms a first circuit node of the capacitor 7 and the second capacitor electrode 73 forms a second circuit node of the capacitor 7. The first and second capacitor electrodes 71, 73 may include a metal or polysilicon, for example. The capacitor dielectric 72 may include silicon oxide, for example.

Figure 13:
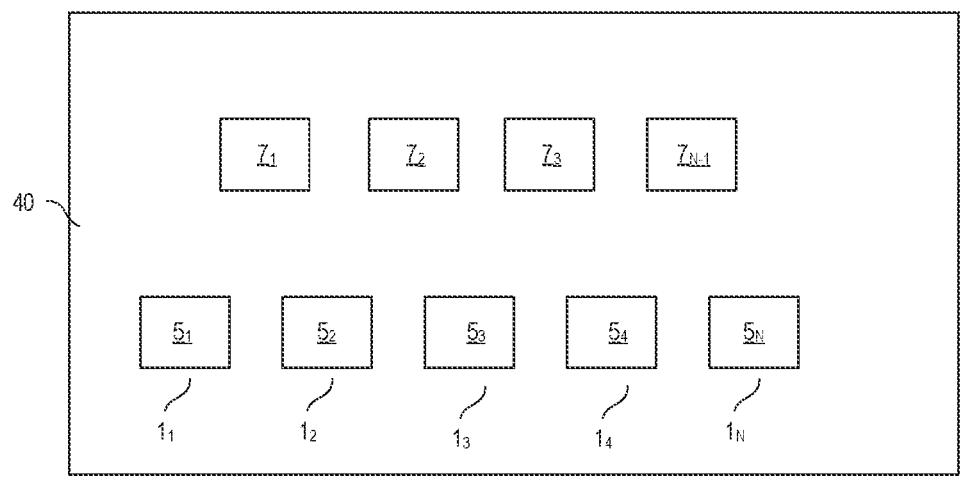
FIG. 13 shows a top view of an electronic circuit of the type according to FIG. 9, wherein the capacitors are formed on top of the insulation layer.

FIG. 13 schematically illustrates a top view of a charge pump circuit that includes a plurality of first electronic devices $1_1$-$1_N$ and a plurality of capacitors $7_1$-$7_{N-1}$ formed on tops of the insulating layer 40. For the purpose of illustration, only the second semiconductor layers $5_1$-$5_N$ of the electronic devices are illustrated in FIG. 13. As can be seen from FIG. 13, these second semiconductor layers $5_1$-$5_N$ are spaced apart from each other (as explained above) and are spaced apart from each of the capacitors $7_1$-$7_{N-1}$. Furthermore, the capacitor $7_1$-$7_{N-1}$ are spaced apart from each other. The semiconductor devices $1_1$-$1_N$ may be connected with each other and may be connected with the respective capacitors $7_1$-$7_{N-1}$ using conventional wiring arrangements formed on top of the insulating layer 4. The wiring arrangement may include a further insulating layer that is formed on top of the insulating layer 4 and that separates conductors of the wiring arrangement from the insulating layer. The further insulating layer includes an oxide layer, a nitride layer, or the like. Such wiring arrangements are commonly known and not illustrated in the drawings.

Some of the aspects explained above are summarized in the following by way of numbered examples.

Example 1. An electronic device, including: a first doped region of a first doping type arranged in a first semiconductor layer of a second doping type complementary to the first doping type; an insulation layer formed on top of the first semiconductor layer and adjoining the first doped region; at least two active device regions arranged in a second semiconductor layer formed on top of the insulation layer; and an electrical connection between one of the at least two active device regions and the first doped region, wherein each of the at least two active device regions is arranged adjacent to the first doped region and separated from the first doped region by the insulation layer.

Example 2. The electronic device of example 1, wherein the electrical connection includes: an electrically conducting via extending through the insulation layer and contacting the first doped region.

Example 3. The electronic device of example 2, further including: a doped semiconductor region formed on top of the electrically conducting via.

Example 4. The electronic device of example 2 or 3, further including: a trench isolation laterally surrounding a section of the first doped region that adjoins the electrically conducting via.

Example 5. The electronic device of any one of the preceding examples, further including: a further trench isolation laterally surrounding the first doped region.

Example 6. The electronic device of any one of examples 1 to 5, wherein the electronic device is a diode in which one of the at least two active device regions is an anode region and another one of the east two active device regions is a cathode region.

Example 7. The electronic device of example 6, further including: a base region arranged between the anode region and the cathode region in the second semiconductor layer.

Example 8. The electronic device of any one of examples 1 to 5, wherein the electronic device is a transistor device in which one of the at least two active device regions is a source region and another one of the at least two active device regions is a drain region, and wherein the electronic device further includes: a body region arranged in the second semiconductor layer between the source region and the drain region; and a gate electrode arranged adjacent to the body region and dielectrically insulated from the body region by a gate dielectric.

Example 9. The electronic device of example 8, wherein the drain region is electrically connected to the gate electrode.

Example 10. The electronic device of any one of the preceding examples, wherein the first semiconductor layer is a silicon layer, and wherein the insulation layer is a silicon oxide layer.

Example 11. The electronic device of any one of the preceding examples, wherein the second semiconductor layer is one of a silicon layer and a silicon-germanium layer.

Example 12. The electronic device of any one of the preceding examples, doping concentrations of the first doped region and the first semiconductor layer are adapted to one another such that a voltage blocking capability of a pn-junction formed between the first doped region and the first semiconductor layer is higher than a dielectric strength of the insulation layer.

Example 13. An electronic circuit, including: a plurality of electronic devices each according to any one of examples 1 to 12; and a plurality of capacitors, wherein the first doped regions of the electronic devices are arranged in the same first semiconductor layer and are spaced apart from each other in the first semiconductor layer, wherein the electronic devices are connected in series, wherein each of the capacitors is connected to a respective one of a plurality of taps, wherein each tap is a circuit node between a respective pair of the electronic devices in the series circuit.

Example 14. The electronic circuit of example 13, wherein the insulating layer of each of the electronic devices is a respective section of a common insulation layer, and wherein the capacitors are formed on top of the common insulation layer.

Example 15. The electronic circuit of example 13 or 14, further including: a plurality of contact regions of the second doping type arranged in the first semiconductor layer and connected to a circuit node configured to receive a supply potential, wherein each of the contact regions is arranged between a respective pair of neighboring first doped regions.

What is claimed is:

1. An electronic device, comprising:
   a first doped region of a first doping type arranged in a first semiconductor layer of a second doping type complementary to the first doping type;
   an insulation layer formed on top of the first semiconductor layer and adjoining the first doped region;
   at least two active device regions arranged in a second semiconductor layer formed on top of the insulation layer; and
   an electrical connection between one of the at least two active device regions and the first doped region,
   wherein each of the at least two active device regions is arranged adjacent to the first doped region and separated from the first doped region by the insulation layer,
   wherein the electronic device is a diode in which one of the at least two active device regions is an anode region and another one of the at least two active device regions is a cathode region.

2. The electronic device of claim 1, wherein the electrical connection comprises:
   an electrically conducting via extending through the insulation layer and contacting the first doped region.

3. The electronic device of claim 2, further comprising:
   a doped semiconductor region formed on top of the electrically conducting via.

4. The electronic device of claim 2, further comprising:
   a trench isolation laterally surrounding a section of the first doped region that adjoins the electrically conducting via.

5. The electronic device of claim 1, further comprising:
   a trench isolation laterally surrounding the first doped region.

6. The electronic device of claim 1, further comprising:
   a base region arranged between the anode region and the cathode region in the second semiconductor layer.

7. The electronic device of claim 1, wherein the electronic device is a transistor device in which one of the at least two active device regions is a source region and another one of the at least two active device regions is a drain region, and wherein the electronic device further comprises:
   a body region arranged in the second semiconductor layer between the source region and the drain region; and
   a gate electrode arranged adjacent to the body region and dielectrically insulated from the body region by a gate dielectric.

8. The electronic device of claim 7, wherein the drain region is electrically connected to the gate electrode.

9. The electronic device of claim 1, wherein the first semiconductor layer is a silicon layer, and wherein the insulation layer is a silicon oxide layer.

10. The electronic device of claim 1, wherein the second semiconductor layer is one of a silicon layer and a silicon-germanium layer.

11. An electronic circuit, comprising:
    a plurality of electronic devices each according to claim 1; and
    a plurality of capacitors,
    wherein the first doped regions of the plurality of electronic devices are arranged in the same first semiconductor layer and are spaced apart from each other in the first semiconductor layer,
    wherein the plurality of electronic devices are connected in series,
    wherein each capacitor of the plurality of capacitors is connected to a respective one of a plurality of taps,
    wherein each tap of the plurality of taps is a circuit node between a respective pair of the electronic devices in the series circuit.

12. The electronic circuit of claim 11, wherein the insulating layer of each of the electronic devices is a respective section of a common insulation layer, and wherein the capacitors are formed on top of the common insulation layer.

13. The electronic circuit of claim 11, further comprising:
    a plurality of contact regions of the second doping type arranged in the first semiconductor layer and connected to a circuit node configured to receive a supply potential,
    wherein each contact region of the plurality of contact regions is arranged between a respective pair of neighboring ones of the first doped regions.

14. An electronic device, comprising:
    a first doped region of a first doping type arranged in a first semiconductor layer of a second doping type complementary to the first doping type;
    an insulation layer formed on top of the first semiconductor layer and adjoining the first doped region;
    at least two active device regions arranged in a second semiconductor layer formed on top of the insulation layer; and
    an electrical connection between one of the at least two active device regions and the first doped region,
    wherein each of the at least two active device regions is arranged adjacent to the first doped region and separated from the first doped region by the insulation layer,
    wherein one of the at least two active device regions forms an anode region and another one of the at least two active device regions forms a cathode region.

* * * * *